(12) United States Patent
Itano et al.

(10) Patent No.: US 8,183,084 B2
(45) Date of Patent: May 22, 2012

(54) METHODS OF MANUFACTURING SOLID STATE IMAGE PICKUP DEVICES

(75) Inventors: Tetsuya Itano, Tokyo (JP); Fumihiro Inui, Kanagawa (JP); Masanori Ogura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 12 days.

(21) Appl. No.: 12/911,844

(22) Filed: Oct. 26, 2010

(65) Prior Publication Data

US 2011/0045632 A1 Feb. 24, 2011

Related U.S. Application Data

(62) Division of application No. 11/132,242, filed on May 19, 2005, now Pat. No. 7,838,957, which is a division of application No. 10/665,593, filed on Sep. 22, 2003, now Pat. No. 7,087,983.

(30) Foreign Application Priority Data

Sep. 20, 2002 (JP) ................................ 2002-275019

(51) Int. Cl.
*H01L 21/00* (2006.01)
(52) U.S. Cl. ................................ 438/98; 257/E31.111
(58) Field of Classification Search .................. 257/465, 257/466, E31.111, E31.124; 438/98
See application file for complete search history.

(56) References Cited

U.S. PATENT DOCUMENTS

| | | | |
|---|---|---|---|
| 4,363,696 A | 12/1982 | Nagakubo et al. | |
| 5,561,317 A | 10/1996 | Momma et al. | |
| 5,731,131 A | 3/1998 | Momma et al. | |
| 5,801,814 A * | 9/1998 | Matsumoto | 355/40 |
| 6,073,343 A * | 6/2000 | Petrick et al. | 29/825 |
| 6,197,452 B1 | 3/2001 | Matumoto | |
| 6,204,912 B1 | 3/2001 | Tuschiya et al. | |

(Continued)

FOREIGN PATENT DOCUMENTS

EP 0 440 470 A2 8/1991

(Continued)

OTHER PUBLICATIONS

Communication pursuant to Article 71(1) EPC dated Aug. 30, 2007, issued in corresponding European patent application No. 03 021 244.3.

(Continued)

*Primary Examiner* — Allan R Wilson
(74) *Attorney, Agent, or Firm* — Fitzpatrick, Cella, Harper & Scinto

(57) ABSTRACT

A method of manufacturing a solid state image pickup device having a plurality of pixels each including a photoelectric conversion region for converting light into a signal charge, and a plurality of wiring layers including first and second wiring layers. The method includes steps of forming the first wiring layer as a pattern by dividing a desired pattern into a plurality of patterns, connecting the divided patterns, and exposing the plurality of patterns, and forming the second wiring layer as a pattern by batch exposure processing. A connecting position along which the divided patterns are connected is arranged in a pixel area in which the plurality of pixels are arranged. The wiring included in the first wiring layer is formed by a vertical direction wiring arranged in parallel with and not crossing the connecting position in the pixel area, and the wiring included in the second wiring layer is formed by a horizontal direction wiring arranged in parallel with and crossing the connecting position in the pixel area.

13 Claims, 13 Drawing Sheets

U.S. PATENT DOCUMENTS

| | | | |
|---|---|---|---|
| 6,518,180 B1 | 2/2003 | Fukuda | |
| 6,667,486 B2 * | 12/2003 | Ohta et al. | 250/492.22 |
| 6,741,283 B1 | 5/2004 | Merrill et al. | |
| 6,833,234 B1 * | 12/2004 | Bloomstein et al. | 430/321 |
| 6,977,684 B1 | 12/2005 | Hashimoto et al. | |
| 2001/0025916 A1 | 10/2001 | Kobayashi et al. | |
| 2002/0057847 A1 * | 5/2002 | Hayashi et al. | 382/282 |
| 2002/0100915 A1 | 8/2002 | Hynecek | |
| 2003/0001798 A1 * | 1/2003 | Okuyama | 345/30 |

FOREIGN PATENT DOCUMENTS

| | | |
|---|---|---|
| EP | 0 959 501 A2 | 11/1999 |
| JP | 4-326507 A | 11/1992 |
| JP | 5-127186 A | 5/1993 |
| JP | 05-136020 A | 6/1993 |

OTHER PUBLICATIONS

De Raedt, W., et al., "Sub-100 NM Gate Mesfet by Electron Beam Mix & Match," 8226 Microelectronic Engineering, May 9, 1989, Nos. 1/4, Amsterdam, NL. pp. 341-344.

Stover, H. L., et al. "Mix and match of 10:1 wafer steppers with die-by-die alignment to 1:1 proximity and projection systems," reprinted from Optical Microlithography-Technology . . . , SPIE vol. 334, pp. 120-131 (1982). pp. 1-12, Pub. date Jan. 1, 1992.

European Search Report dated Jan. 11, 2006, issued in corresponding European patent application No. EP 03 02 1244, forwarded in a Communication dated Jan. 26, 2006.

* cited by examiner

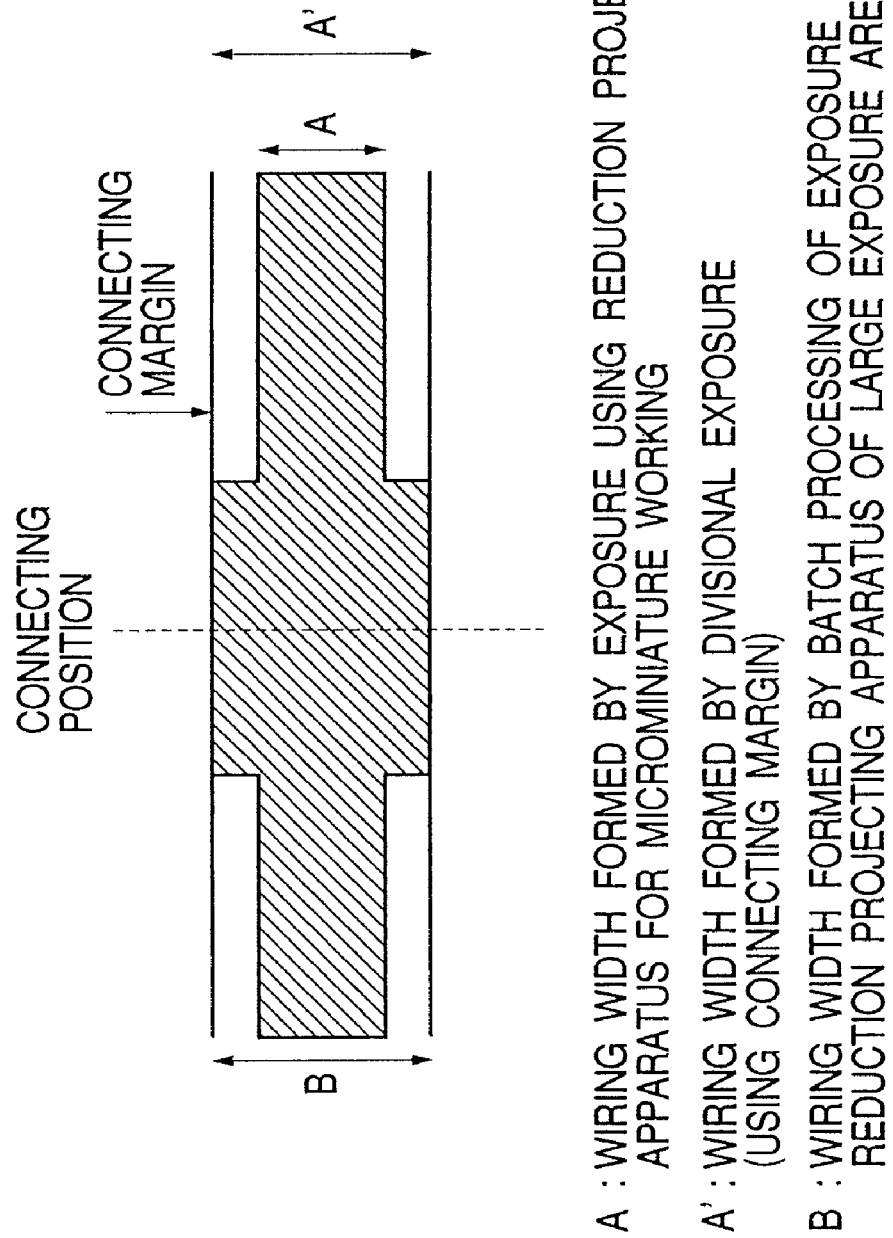

METHODS OF MANUFACTURING SOLID STATE IMAGE PICKUP DEVICES

This application is a divisional application of copending U.S. patent application Ser. No. 11/132,242, filed on May 19, 2005, and published as U.S. Patent Application Publication No. 2005/0212096 A1 on Sep. 29, 2005, which is a divisional of U.S. patent application Ser. No. 10/665,593, filed on Sep. 22, 2003, which issued as U.S. Pat. No. 7,087,983 on Aug. 8, 2006.

This application also claims the benefit of Japanese Patent Application No. 2002-275019, filed Sep. 20, 2002, which is hereby incorporated by reference herein in its entirety.

BACKGROUND OF THE INVENTION

1. Field of the Invention

The invention relates to methods of manufacturing a semiconductor device and a solid state image pickup device and, more particularly, to a method of manufacturing a semiconductor device and a solid state image pickup device using connecting exposure in which a desired pattern is divided into a plurality of patterns, the divided patterns are connected, and exposure is executed.

2. Related Background Art

In the case of forming a semiconductor device of a large chip size onto a semiconductor substrate, for example, a method of manufacturing the semiconductor device disclosed in U.S. Pat. No. 5,561,317, or the like, has been known.

FIGS. 13A to 13C are diagrams for explaining the manufacturing method of the semiconductor device disclosed in the U.S. patent referenced above.

FIG. 13A is a diagram showing a schematic pattern of a first layer on the semiconductor substrate. FIG. 13B is a diagram showing a schematic pattern of a first reticle which is used to form the first layer in FIG. 13A. FIG. 13C is a diagram showing a schematic pattern of a second reticle for forming a second layer.

Three patterns A, B, and C are divisionally provided in a first reticle 105. An IC pattern is formed in each pattern. The patterns A, B, and C are vertically arranged and connected and one chip is constructed by the connected patterns A, B, and C.

The first reticle 105 is set into a reduction projection type exposing apparatus. A layout of the first layer on a semiconductor substrate 101 (hereinafter, referred to as a wafer 101) is programmed in a manner such that the connected patterns shown in FIG. 13A are printed onto the wafer 101 by a system associated with the exposing apparatus. An alignment mark 103 shown in FIG. 13B is an alignment mark of a die-by-die system. As shown in FIG. 13A, after the patterns are exposed, the alignment marks 103 are formed on both sides of each of the connected patterns A, B, and C on the semiconductor substrate and become alignment marks (parent marks) 102 for the second layer.

When the first layer is printed, in the first reticle 105, by changing a position of a masking blade of the reduction projection type exposing apparatus every shot (pattern A, B, C), in the case of printing a portion of a pattern A, the portions of the patterns B and C are hidden by the blade, thereby preventing light from transmitting to the patterns B and C. When each of the patterns B and C is printed, processes are executed in a manner similar to those mentioned above.

After the patterns A, B, and C are formed, by executing ordinary semiconductor manufacturing processes such as etching, impurity diffusion, a CVD (Chemical Vapor Deposition) method, and the like, in accordance with the patterns, patterns in the second layer are formed.

Subsequently, in the second layer, a second reticle 106 shown in FIG. 13C is used and the alignment marks 102 serving as parent marks formed in the first layer are aligned so as to be matched with alignment marks 104 serving as child marks. That is, the alignment marks are aligned so that a pattern A' lies on the pattern A and a pattern B' lies on the pattern B. When patterns A', B', and C' are exposed, they are exposed by changing the position of the masking blade in a manner similar to the first layer.

In the prior art, in the case wherein a wiring having an area which overlaps the connecting position is formed by using a connecting exposure technique such that the divided patterns are connected and exposed, the wiring which overlaps the connecting position is formed so as to have a margin which takes into consideration the alignment precision of the right and left shots with respect to the connecting position, as shown in FIG. 14. In FIG. 14, A denotes a width of wiring formed by the exposure using the reduction projecting apparatus for microminiature working; A' a width of wiring formed by divisional exposure; and B a width of wiring formed by batch processing of exposure using the reduction projecting apparatus of a large exposure area. A' is set to be larger than A in consideration of the margin in the connecting area. Although a method of changing the connecting position for every layer, for example, a method of changing the connecting position of the second layer to a position which perpendicularly crosses the connecting position of the first layer is also considered, there is a problem such that the apparatus and the processes become complicated.

However, in the semiconductor device and solid state image pickup device having a plurality of wiring layers, in which the wiring layer having the area which overlaps the connecting position and the wiring layer which does not have the area which overlaps the connecting position exist, if the patterns obtained by dividing the wiring layer having the area which overlaps the connecting position are connected and formed, since the patterns are formed in consideration of the alignment margin as mentioned above, there is a case where, in spite of the fact that the number of processing steps is increased and the reduction projecting apparatus for microminiature working is used, it is not advantageous in terms of the wiring width and a space between the wirings as compared with those in the case of forming the patterns by the batch processing of exposure by using the reduction projecting apparatus of the large exposure area.

SUMMARY OF THE INVENTION

The invention is made in consideration of the above problems and, in a manufacturing method of a semiconductor device using connecting exposure, it is an object of the invention to provide a method of efficiently manufacturing a semiconductor device in which the number of processing steps is reduced and high sensitivity is obtained.

To accomplish the above object, according to the invention, there is provided a method of manufacturing a semiconductor device having a plurality of wiring layers, wherein a first wiring layer is formed as a pattern by dividing a desired pattern into a plurality of patterns, connecting the divided patterns, and exposing them, the first wiring layer being formed in parallel with a connecting position, and a second wiring layer which intersects the connecting position of the first wiring layer is formed as a pattern by batch exposure processing.

In a manufacturing method of manufacturing a solid state image pickup device using connecting exposure, it is another object of the invention to provide a method of efficiently manufacturing a solid state image pickup device in which the number of processing steps is reduced and high sensitivity is obtained.

To accomplish the above object, according to the invention, there is provided a manufacturing method of manufacturing a solid state image pickup device including pixels each having a photoelectric converting area for converting light into signal charges and a plurality of wiring layers comprising a first wiring layer and a second wiring layer, wherein the first wiring layer is formed as a pattern by dividing a desired pattern into a plurality of patterns, connecting the divided patterns, and exposing them, and the second wiring layer is formed as a pattern by batch exposure processing.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 14 is a diagram for explaining a shape of a wiring at a connecting position in the case of using connecting exposure in the prior art.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Embodiment 1

Figure 1:
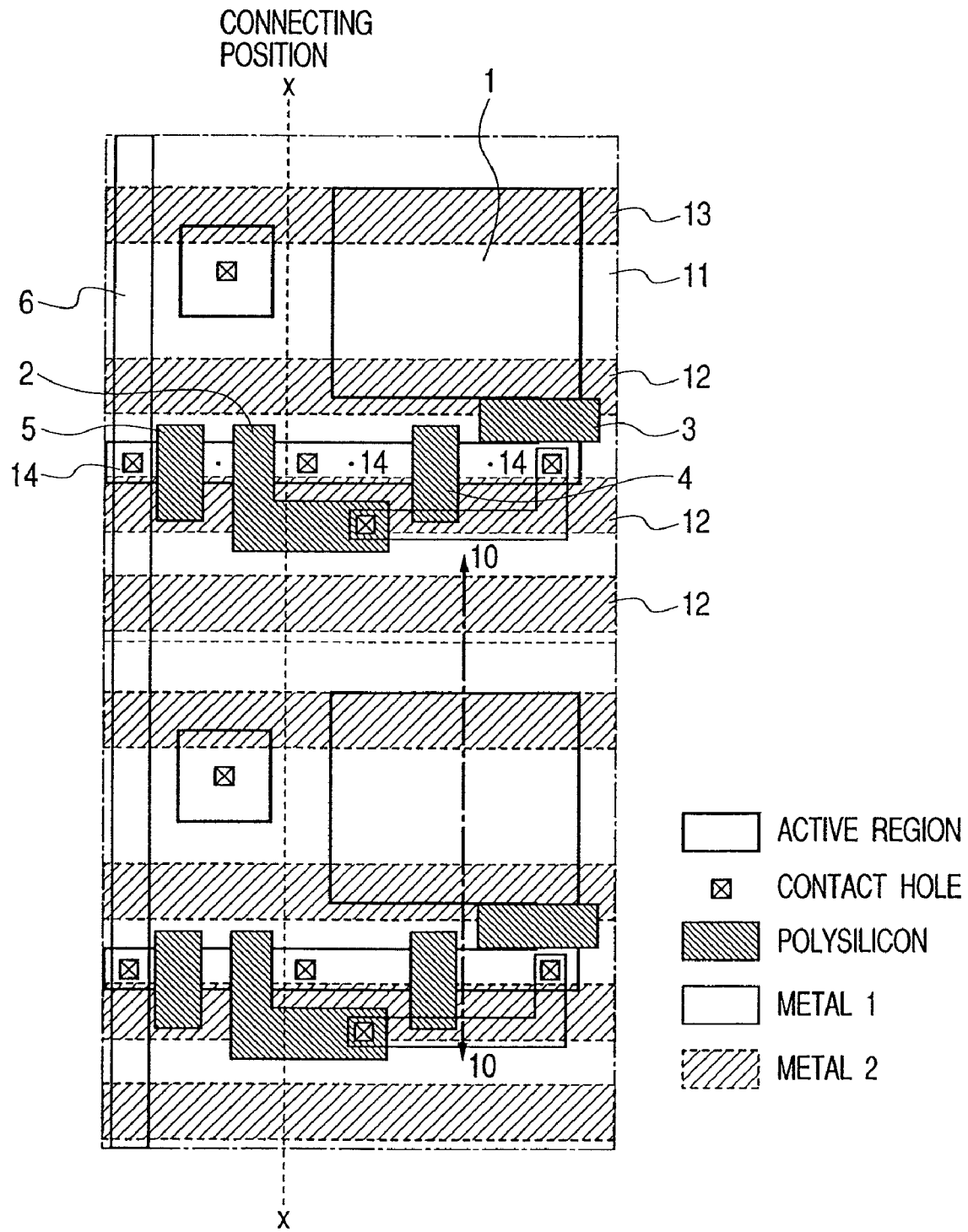
FIG. 1 is a plan view of a unit pixel of a first embodiment of a solid state image pickup device formed by using a manufacturing method of manufacturing a solid state image pickup device of the invention.

FIG. 1 is a plan view of a semiconductor device formed by using a method of manufacturing the semiconductor device of the invention. In the embodiment, a solid state image pickup device having photoelectric converting areas for converting light into signal charges will be explained as an example of the semiconductor device. However, the invention is not limited to the solid state image pickup device, but it is sufficient to use a semiconductor device having a plurality of wiring layers.

In FIG. 1, reference numeral 1 denotes a photodiode serving as a photoelectric converting area; 2, a source follower input MOS transistor serving as an amplifying transistor; 3, a transfer MOS transistor serving as a transfer switch; 4, a reset MOS transistor serving as a reset switch; 5, a select MOS transistor serving as a selecting switch; 6, a vertical signal line (vertical direction wiring) formed by a first wiring layer; and 11, a unit pixel area. As a unit pixel area 11 in the embodiment, the unit pixel area formed by a process of a Complementary Metal Oxide Semiconductor (CMOS) including the photodiode 1, source follower input MOS transistor 2, transfer MOS transistor 3, and select MOS transistor 5 is used as an example. However, the invention is not limited to such a pixel structure, but can be applied to an IC chip including a logic circuit, a CCD type image pickup device, or the like, so long as a plurality of wiring layers are used. Reference numeral 12 denotes a drive wiring (horizontal direction wiring) formed by a second wiring layer; 13, a GND wiring (horizontal direction wiring) formed by the second wiring layer; 14, a source-drain region of the transistor; and X-X, a connecting position at the time when a plurality of patterns are connected by using a connecting exposure technique. The connecting position is set in the case of forming the vertical signal line, or the like, formed by the first wiring layer and arranged in parallel with a vertical output line.

Each of the first wiring layer and the second wiring layer can be replaced with a plurality of wiring layers.

For example, although the drive wiring 12 and the GND wiring 13 are formed as a first wiring layer by the same wiring layer in the embodiment, they can be formed by different wiring layers. A combination of the wirings is not limited to it either.

In the diagram, a connection of a GND and the GND wiring and a connection of a gate and the drive wiring are omitted.

Although only two pixels are shown in FIG. 1, in an actual solid state image pickup device, a number of pixels with such a structure are adjacently arranged in a two-dimensional shape.

The embodiment is characterized in that the vertical signal line 6, which does not have an area which overlaps the connecting position, is formed by, for example, the connecting exposure by the reduction projecting apparatus for microminiature working and the drive wiring 12 and the GND wiring 13 each having the area which overlaps the connecting position are formed by batch exposure processing.

That is, it is characterized in that the second wiring layer having the area which overlaps the connecting position is formed as a pattern by the batch exposure processing.

In the first wiring layer to form the wiring, which does not have the area which overlaps the connecting position, microminiature wirings can be formed by a reduction projecting apparatus for microminiature working. That is, the pattern is obtained by dividing a desired pattern into a plurality of patterns, connecting the divided patterns, and exposing them.

Therefore, according to the wiring layer to form the wiring having the area which overlaps the connecting position, as compared with the case of forming the wiring layer by the connecting exposure, the number of processing steps can be remarkably reduced and a solid state image pickup device of high sensitivity can be efficiently obtained.

Figure 2:
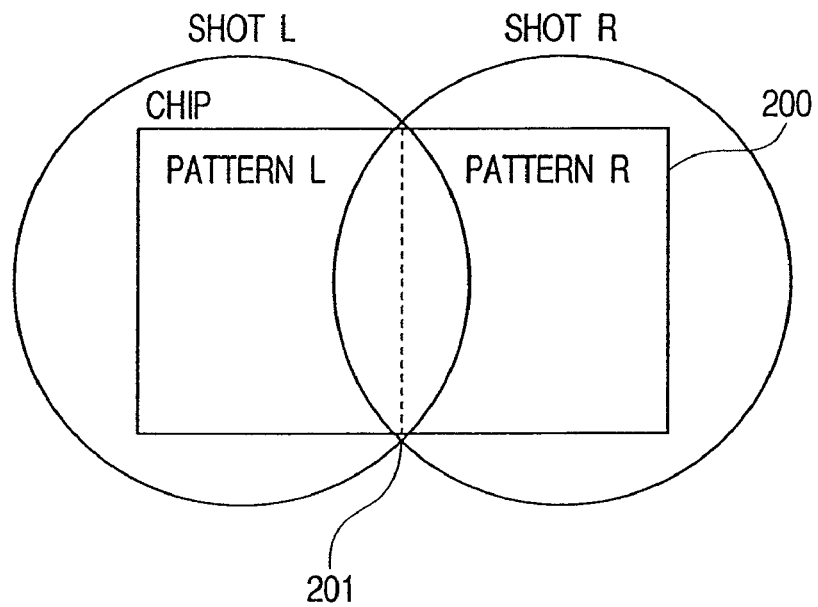
FIG. 2 is a plan view for explaining connecting exposure in the first embodiment.
Figure 3:
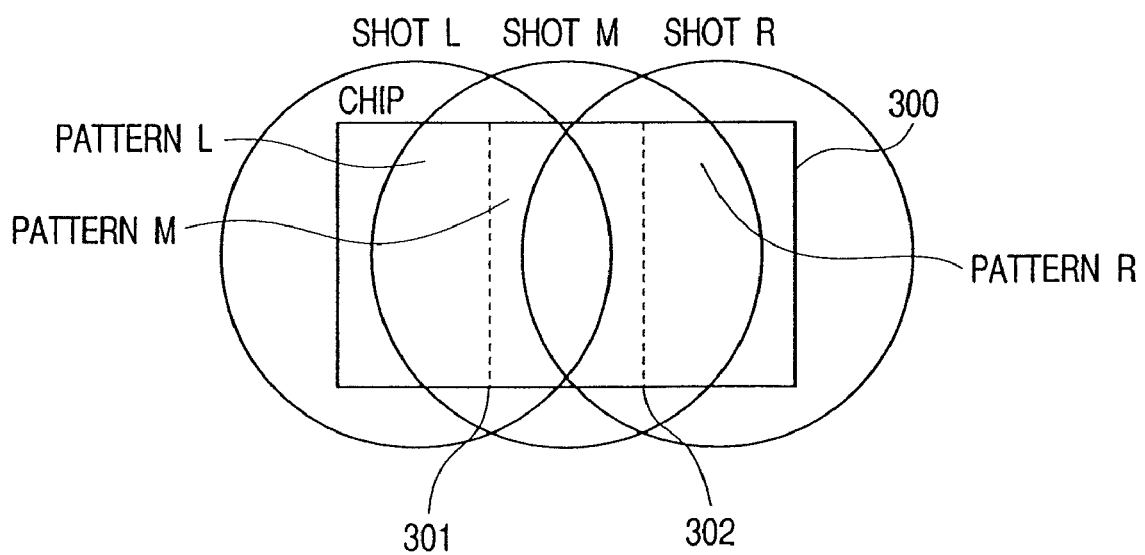
FIG. 3 is a plan view for explaining connecting exposure in the first embodiment.

For example, assuming that the solid state image pickup device as a semiconductor device has a plurality of pixels, as shown in FIG. 1, and has a rectangular shape in which a major side is set in the lateral direction and a minor side is set in the vertical direction, since an aspect ratio of the valid area in the shot in the pattern created by the reduction projecting apparatus is equal to almost (vertical:lateral=1:1), it is desirable to use a method of dividing a chip into two patterns in the horizontal direction, as shown in FIG. 2, or a method of dividing the chip into three patterns in the horizontal direction, as shown in FIG. 3, in order to realize the efficient connecting exposure.

FIG. 2 shows the case where a chip 200 is divided into two patterns of a pattern L and a pattern R at a connecting position 201, the pattern L is exposed by a shot L, and the pattern R is exposed by a shot R, respectively.

FIG. 3 shows the case where a chip 300 is divided into three patterns of the pattern L, a pattern M, and the pattern R at connecting positions 301 and 302, the pattern L is exposed by the shot L, the pattern M is exposed by a shot M, and the pattern R is exposed by the shot R, respectively.

Figure 4A:
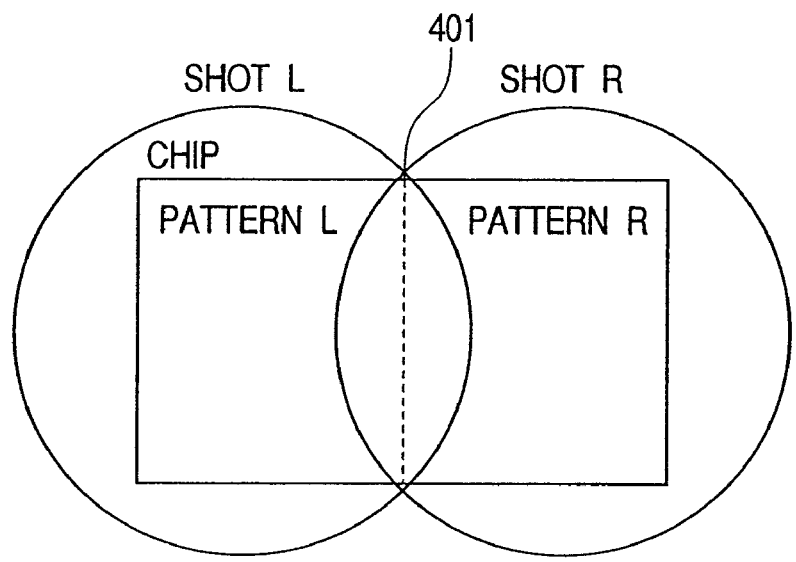
FIGS. 4A and 4B are diagrams for explaining a method of manufacturing a semiconductor device of the invention.
Figure 4B:
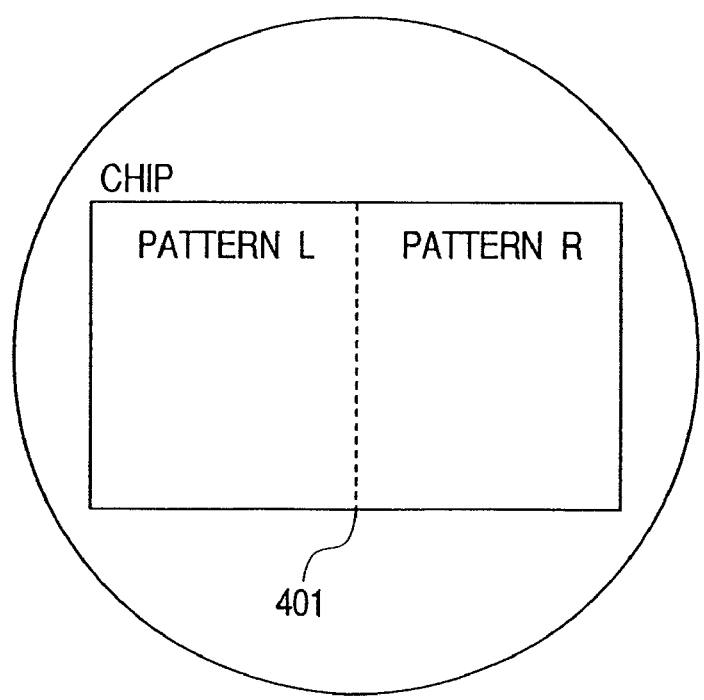

FIG. 4A is a diagram for explaining a state where a first layer (metal 1) including the vertical direction wiring, which does not have the area which overlaps the connecting position of the patterns L and R, is formed as a pattern by the connecting exposure. One chip is divided into two patterns by a dividing position in the diagram and the divided patterns are connecting-exposed by the shots L and R, thereby forming a desired pattern. In the unit pixel of FIG. 1, as a connecting position 401, a position which does not overlap the first layer (metal 1) is selected. FIG. 4B is a diagram for explaining a state where the second layer (metal 2) is formed as a pattern by the batch exposure processing. The reason why the batch exposure processing is used is because if the second layer is divisionally exposed and pattern-formed at the connecting position used in the first layer, the wiring has an area which overlaps the connecting position.

According to the manufacturing method of the embodiment as described above, by assuring a high numerical aperture, the sensitivity can be improved or by obtaining a proper opening shape, the sensitivity of the peripheral pixels can be improved.

Figure 5A:
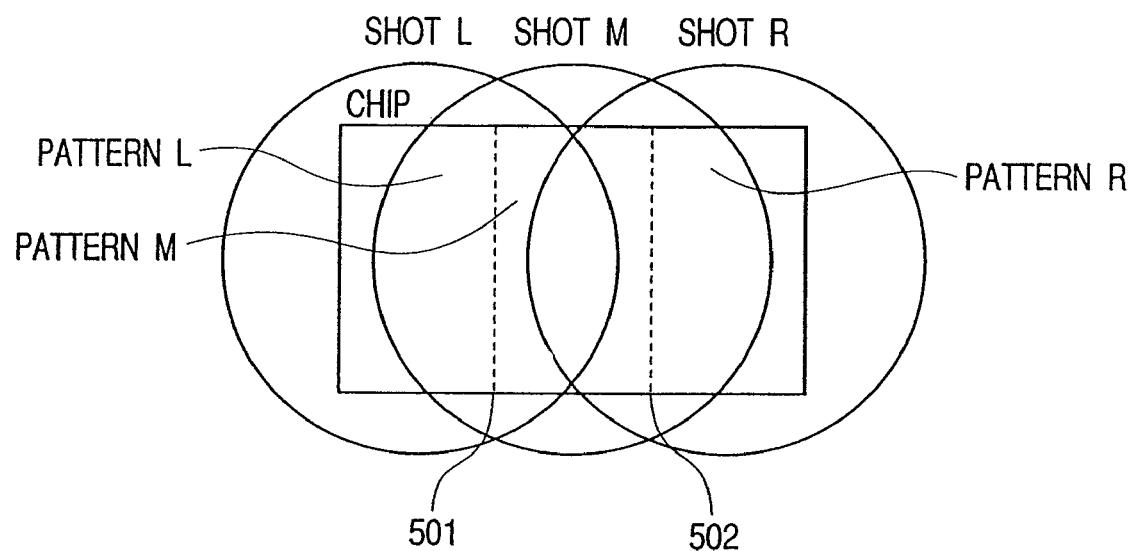
FIGS. 5A and 5B are diagrams for explaining a method of manufacturing a semiconductor device of the invention.
Figure 5B:
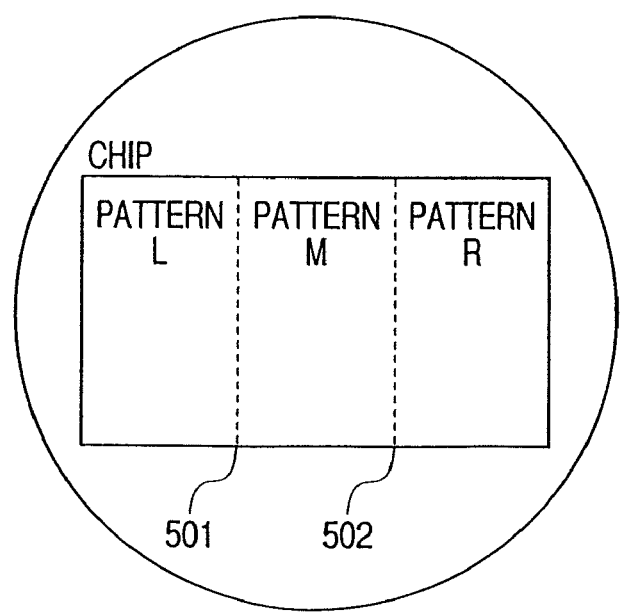

In the shot of the reduction projecting apparatus, the more height an image has, the more the resolution deteriorates. For example, when the height of an image increases, the resolution of a portion near the connecting position 401 in FIG. 4A deteriorates. That is, when a pattern exists near the connecting position 401, a defective pattern can be caused due to the deterioration of the resolution. To avoid such a defective pattern, as shown in FIG. 5B, a method whereby one chip is divided into three patterns by connecting positions 501 and 502 and the divided patterns are connecting-exposed by the shots L, M, and R, thereby forming a desired pattern, is considered. Thus, the semiconductor device or the solid state image pickup device can be formed by forming a better pattern in a portion of a low image, that is, a portion near the center of a lens of high resolution.

The positions of the connecting positions and the number of connecting times can be properly determined in accordance with a size of a chip or performance of the exposing apparatus and are not limited to those shown in the embodiment.

Figure 6:
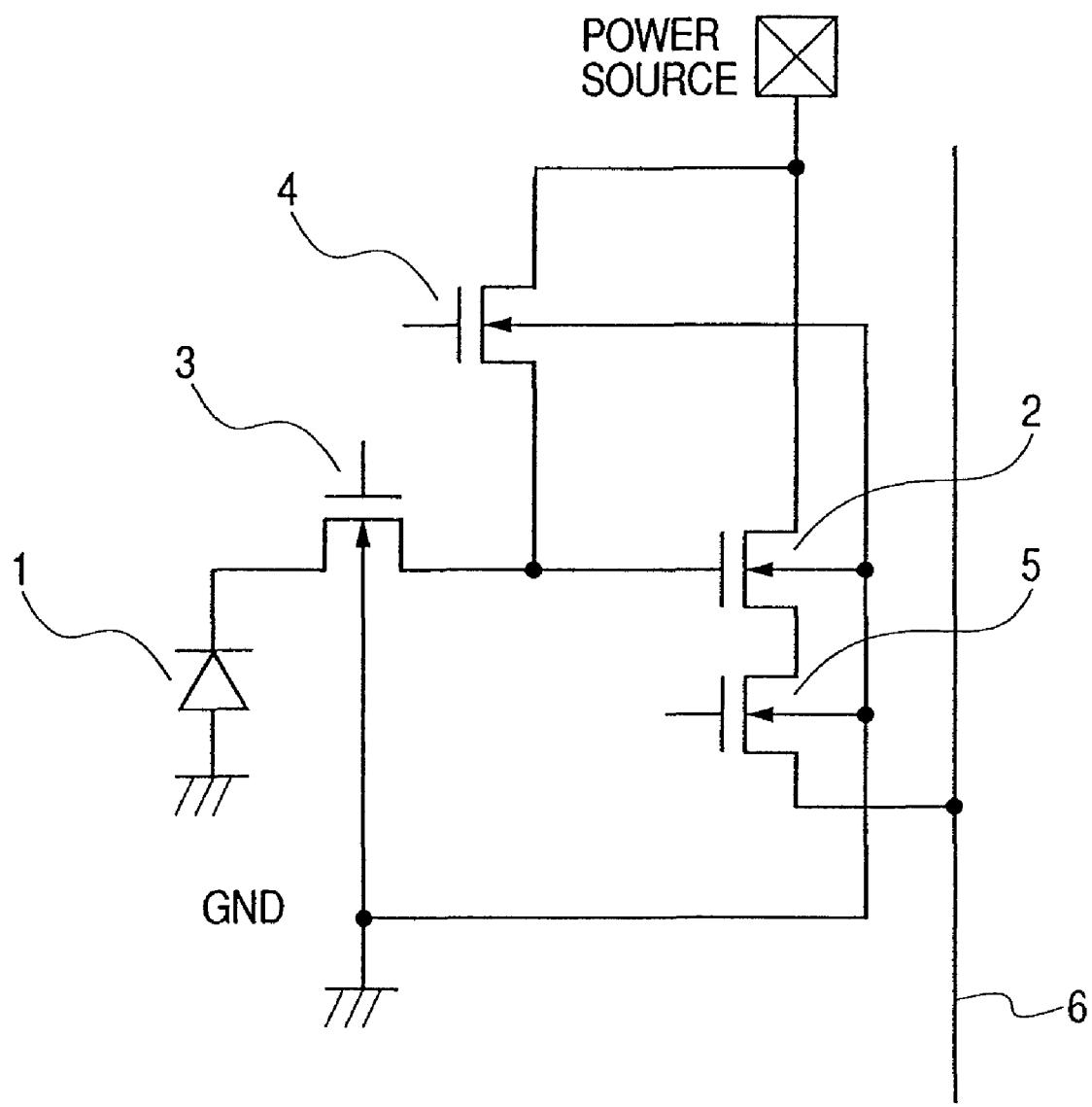
FIG. 6 is an equivalent circuit diagram of a unit pixel of a CMOS sensor in the first embodiment.

Subsequently, FIG. 6 is a circuit diagram showing an example of a unit pixel of a CMOS sensor which can be installed in a solid state image pickup device formed by the method of manufacturing the semiconductor device and the solid state image pickup device of the invention.

Portions similar to those mentioned above are designated by the same reference numerals.

Specifically speaking, the photodiode 1 is connected to a gate of the source follower input MOS transistor 2 via the transfer MOS transistor 3. A source of the source follower input MOS transistor is connected to the vertical signal line 6 via the select MOS transistor 5. The reset MOS transistor 4 to reset the gate of the source follower input MOS transistor 2 to a predetermined electric potential is provided. The GND wiring connected to the GND is provided for every pixel to suppress a transient fluctuation of a GND potential upon driving (not shown) in FIG. 6.

Figure 7:
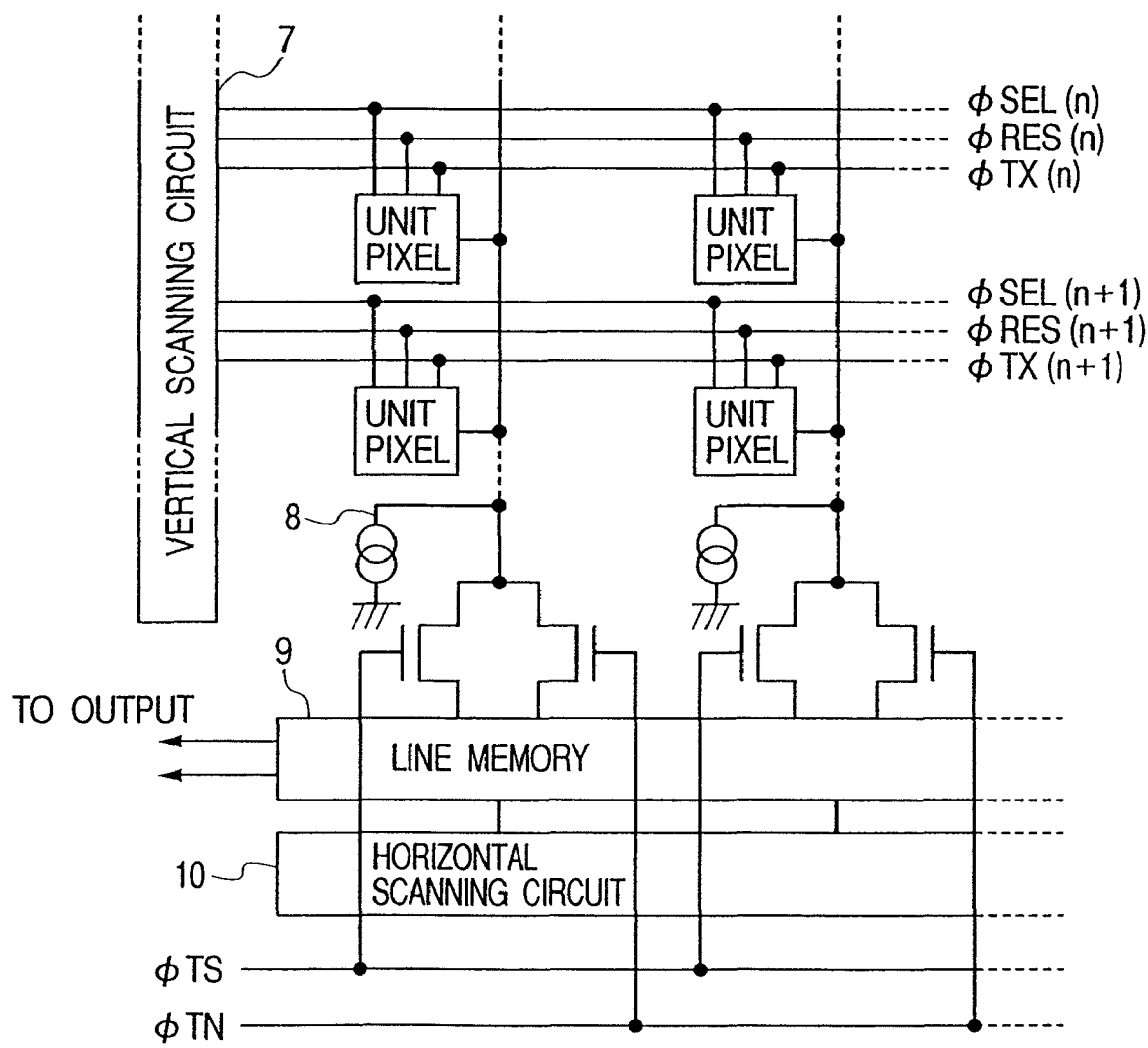
FIG. 7 is an equivalent circuit diagram for explaining the operation of the CMOS sensor in the first embodiment.
Figure 8:
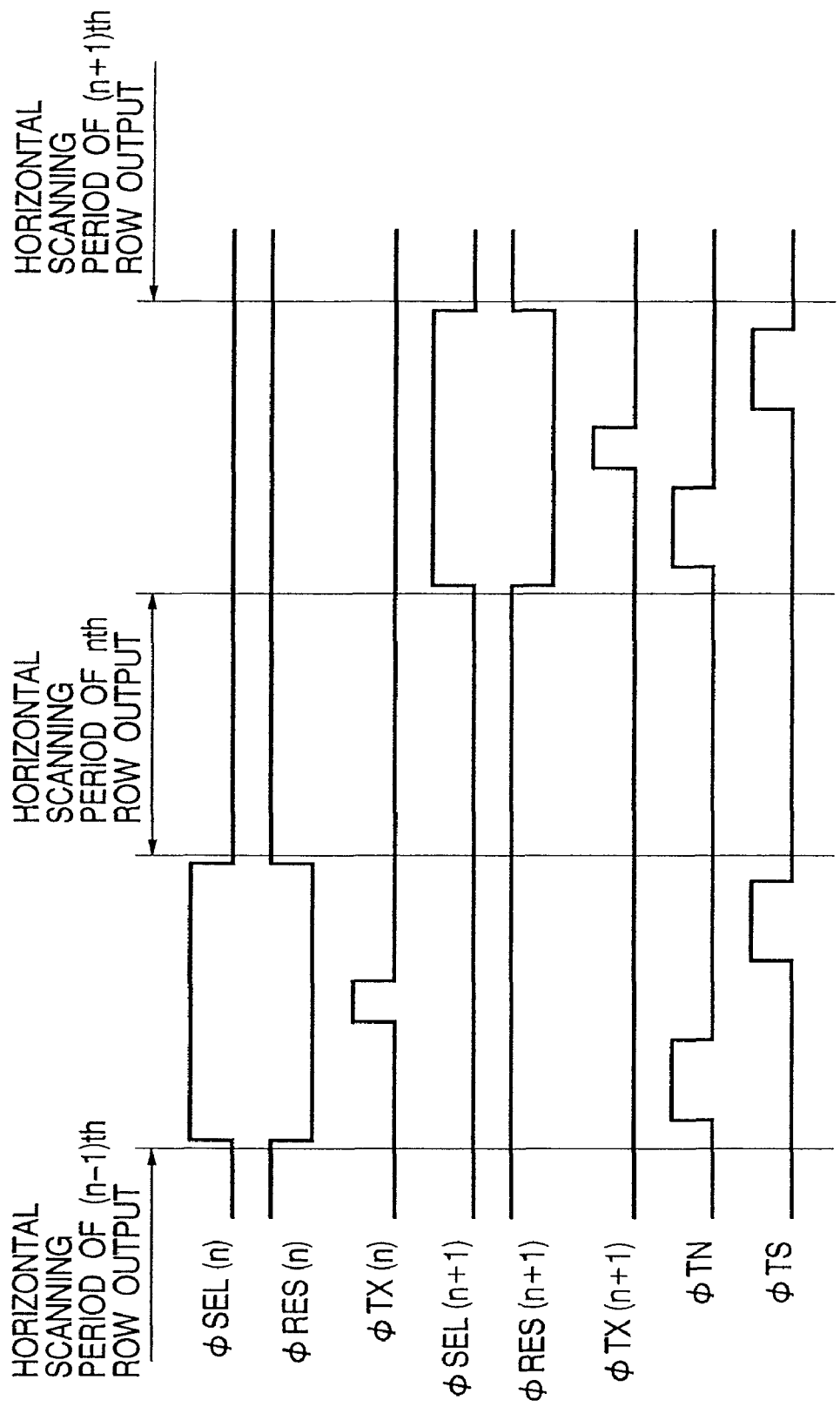
FIG. 8 is a timing chart for explaining the operation of the CMOS sensor in the first embodiment.

Subsequently, the operation of the pixel will be explained with reference to an equivalent circuit diagram of FIG. 7 and a timing chart of FIG. 8. In FIG. 7, a unit pixel is shown by the equivalent circuit diagram of FIG. 6. In FIG. 7, a connection of the unit pixel and the GND is omitted. When a certain row (assumed to be the nth row) is selected by a vertical scanning circuit 7, first, a reset signal fRES(n) is set to the low level and the reset switch is turned off. Subsequently, a selection signal fSEL(n) is set to the high level and the selecting switch is turned on. Thus, the source of the amplifying MOS transistor is made conductive with the vertical output line. A source follower circuit is formed by the selected pixel and a constant current source 8. Subsequently, a signal fTN is set to the high level and an N output corresponding to the reset state of the pixel is read out to a line memory 9 via a transfer gate. After that, the transfer switch is held in an ON state for a predetermined period of time by a transfer pulse fTX(n). A photosignal generated in the photoelectric converting element is transferred to the gate of the amplifying MOS transistor. Subsequently, a signal fTS is set to the high level and an S output corresponding to the photosignal is read out to the line memory. Subsequently, an N signal and an S signal of a column selected by a horizontal scanning circuit 10 are successively read out. By calculating a difference between the N signal and the S signal having a correlation, a photo response output can be obtained.

After the signals of the pixels of the selected row are simultaneously transferred to the line memory, they are successively read out as mentioned above. Therefore, control lines of the select MOS transistor to drive the pixel, the transfer MOS transistor, and the reset MOS transistor are constructed by horizontal direction wirings which overlap the connecting positions and signal lines which do not overlap the connecting positions are constructed by vertical direction wirings. In the embodiment, the GND wiring is formed in the horizontal direction so as to have the area which overlaps the connecting positions.

Embodiment 2

Figure 9:
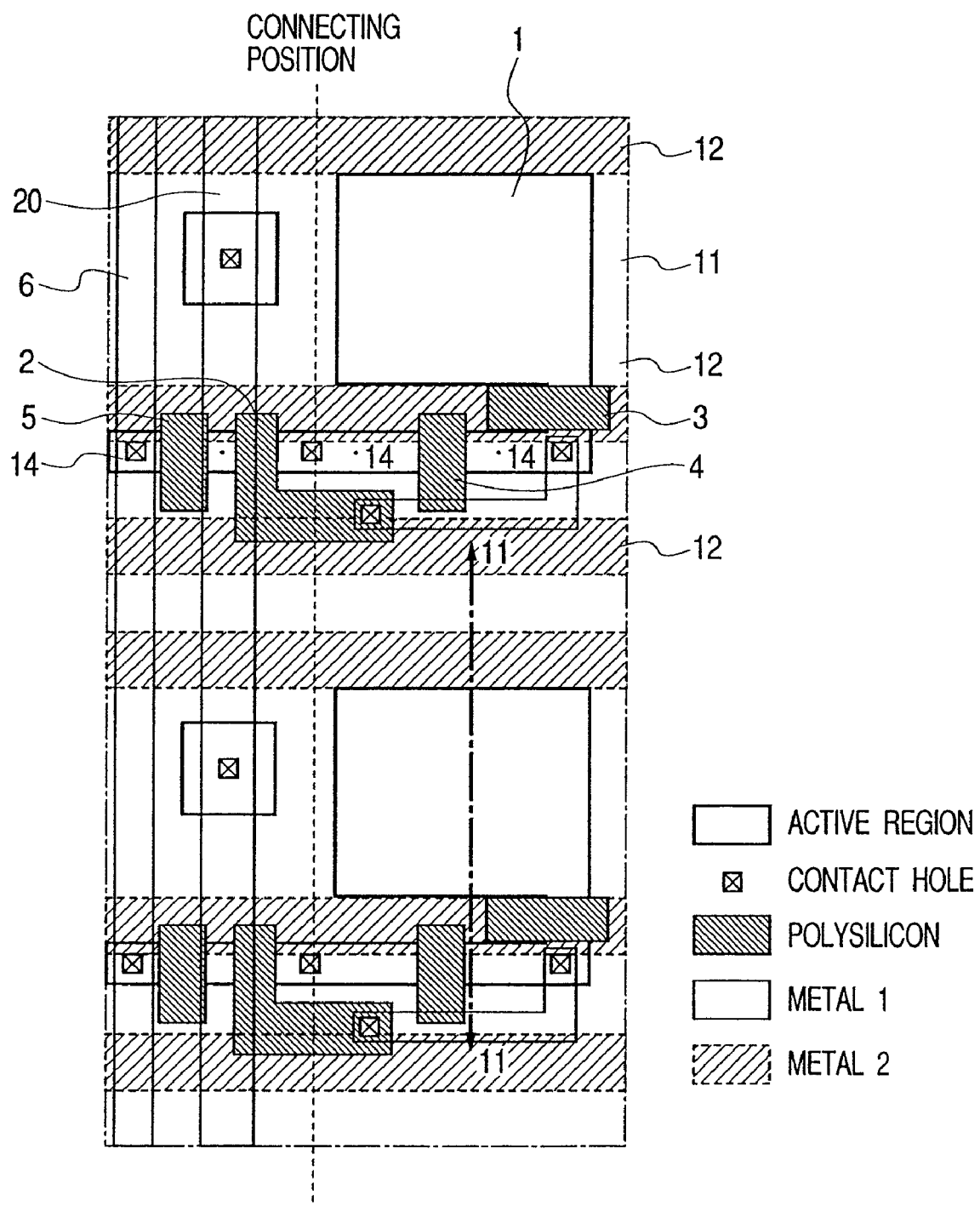
FIG. 9 is a plan view of a unit pixel of a second embodiment of a solid state image pickup device formed by using the method of manufacturing the solid state image pickup device of the invention.

FIG. 9 is a plan view of a semiconductor device formed by using the manufacturing method of the semiconductor device of the invention. In the second embodiment, a solid state image pickup device having a photoelectric converting area for converting light into signal charges will be described as an example of the semiconductor device in a manner similar to the first embodiment. However, the invention is not limited to the solid state image pickup device, but it is sufficient to use a semiconductor device having a plurality of wiring layers.

Reference numeral 20 denotes a GND wiring which is formed by the first wiring layer.

Portions similar to those mentioned above are designated by the same reference numerals.

In a unit pixel shown in FIG. 9, in order to assure a high numerical aperture, the drive wiring 12 having the area which overlaps the connecting position is formed by the second wiring layer and the GND wiring 20 and vertical output line 6, which do not have the area which overlaps the connecting position, are formed as vertical direction wirings by the first wiring layer. In the embodiment, the horizontal direction wiring serving as a second wiring layer is constructed by (metal 2) and the first wiring layer is constructed by (metal 1).

The embodiment relates to an example of a layout diagram in the case wherein the GND wiring of the unit pixel shown in FIG. 6 is constructed by the vertical direction wiring. In the diagram, a connection between the gate and the drive wiring is omitted. That is, the number of wirings which are formed by the divisional exposure is set to be larger than the number of wirings which are formed by the batch processing of exposure.

Although only two pixels are shown in FIG. 9, in an actual solid state image pickup device, a number of pixels of such a structure are adjacently arranged in a two-dimensional shape.

The second embodiment differs from the first embodiment with respect to the following point. That is, in the first embodiment, the GND wiring 13 is arranged by the batch processing of exposure so as to have the area which overlaps the connecting position. In the second embodiment, however, the GND wiring 20 is formed by using the connecting exposure technique so as not to have the area which overlaps the connecting position.

Specifically speaking, as mentioned above, in the case of the wiring layer to form the wiring having the area which overlaps the connecting position, even if the connecting exposure technique is used, since it is necessary to consider the margin, there is a case wherein it is not advantageous in terms of the wiring width and a space between the wirings as compared with those in the case of performing the batch processing of exposure. In other words, in the case of the second wiring layer to form the wiring having the area which overlaps the connecting position, even if either the method by the batch processing of exposure or the method by the connecting exposure is used, the microminiature working cannot be executed with respect to the wiring width and the space between the wirings. There are, consequently, caused a decrease in numerical aperture, deterioration of the sensitivity, deviation of the shape of the opening, and deterioration of the sensitivity of the peripheral pixels. Therefore, it is preferable to reduce the number of wirings which are formed by the second wiring layer having the area which overlaps the connecting position as much as possible.

Figure 10:
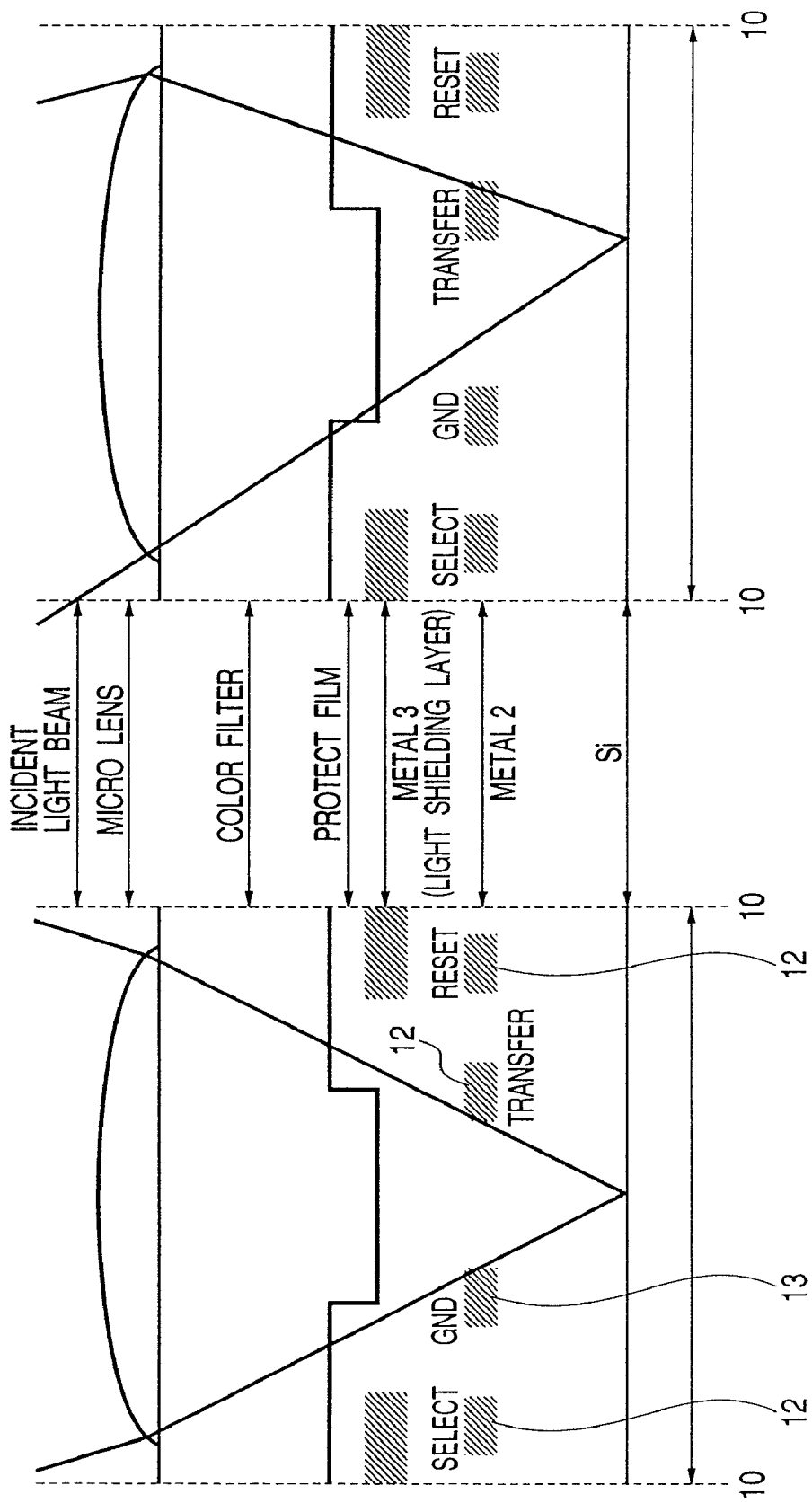
FIGS. 10A and 10B are schematic cross-sectional views taken along the line 10-10 in FIG. 1.
Figure 11:
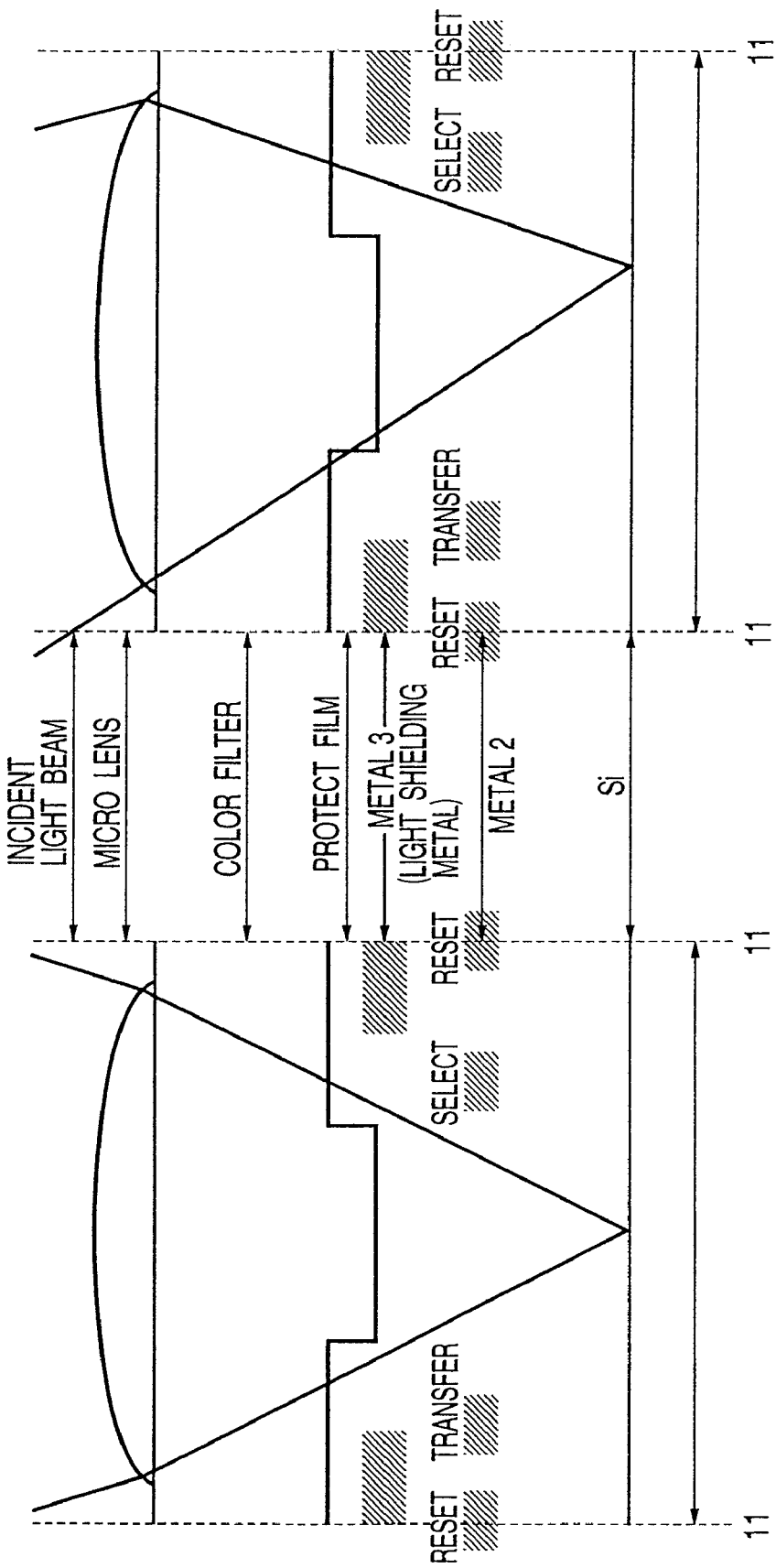
FIGS. 11A and 11B are schematic cross-sectional views taken along the line 11-11 in FIG. 9.

Further specifically explaining, FIGS. 10A, 10B, 11A, and 11B are diagrams schematically showing cross-sectional views taken along the line 10-10 in FIG. 1 and the line 11-11 in FIG. 9, respectively, and each showing a state of an incident light beam. FIG. 10A shows a center pixel arranged near the center of the solid state image pickup device in the case wherein the solid state image pickup device shown in FIG. 1 in the first embodiment has, for example, three million pixels. FIG. 10B shows a peripheral pixel arranged near the edge portion of the solid state image pickup device shown in FIG. 1 in the embodiment in the case wherein the device has, for example, three million pixels. FIG. 11A shows a center pixel arranged near the center of the solid state image pickup device shown in FIG. 9 in the embodiment in the case wherein the solid state image pickup device has, for example, three million pixels. FIG. 11B shows a peripheral pixel arranged near the edge portion of the solid state image pickup device in the case wherein the solid state image pickup device shown in the FIG. 9 embodiment has, for example, three million pixels.

In FIGS. 10A and 10B, (metal 2) is the wiring layer having the drive wirings 12 and GND wiring layers 13 of the select MOS transistor 5, transfer MOS transistor 3, and reset MOS transistor 4. Metal 3 functions as a light shielding layer also serving as a power wiring line. In the center pixel shown in FIG. 10A, an optical path is determined by the GND wiring layer 13 formed by (metal 2) and the drive wiring 12 of the transfer MOS transistor 3. However, as shown in FIG. 10B, in the peripheral pixel, since an area of the light entering from the oblique direction is larger than that of the center pixel, an amount of optical path which is shielded is larger than that of the center pixel (FIG. 10A), so that the sensitivity of the peripheral pixel is lower than that of the center pixel in many cases.

In FIGS. 11A and 11B, since the GND wiring 13 is formed by another metal layer, an opening portion of an optical path is specified by the drive wirings of the transfer MOS transistor 3 and the select MOS transistor 5. Therefore, even if the light enters the peripheral pixel (FIG. 11B) from the oblique direction, since the opening portion is wide, the optical path is hardly shielded. Thus, a solid state image pickup device in which the variation in sensitivity of the center pixel and the peripheral pixel is further reduced can be provided.

In the first and second embodiments, the second wiring layer can be constructed by (metal 1) and the first wiring layer can be constructed by (metal 2). In this case, by pattern-forming (metal 2) by the connecting exposure and pattern-forming (metal 1) by the batch processing of exposure, the effects of the embodiments are obtained.

Figure 12:
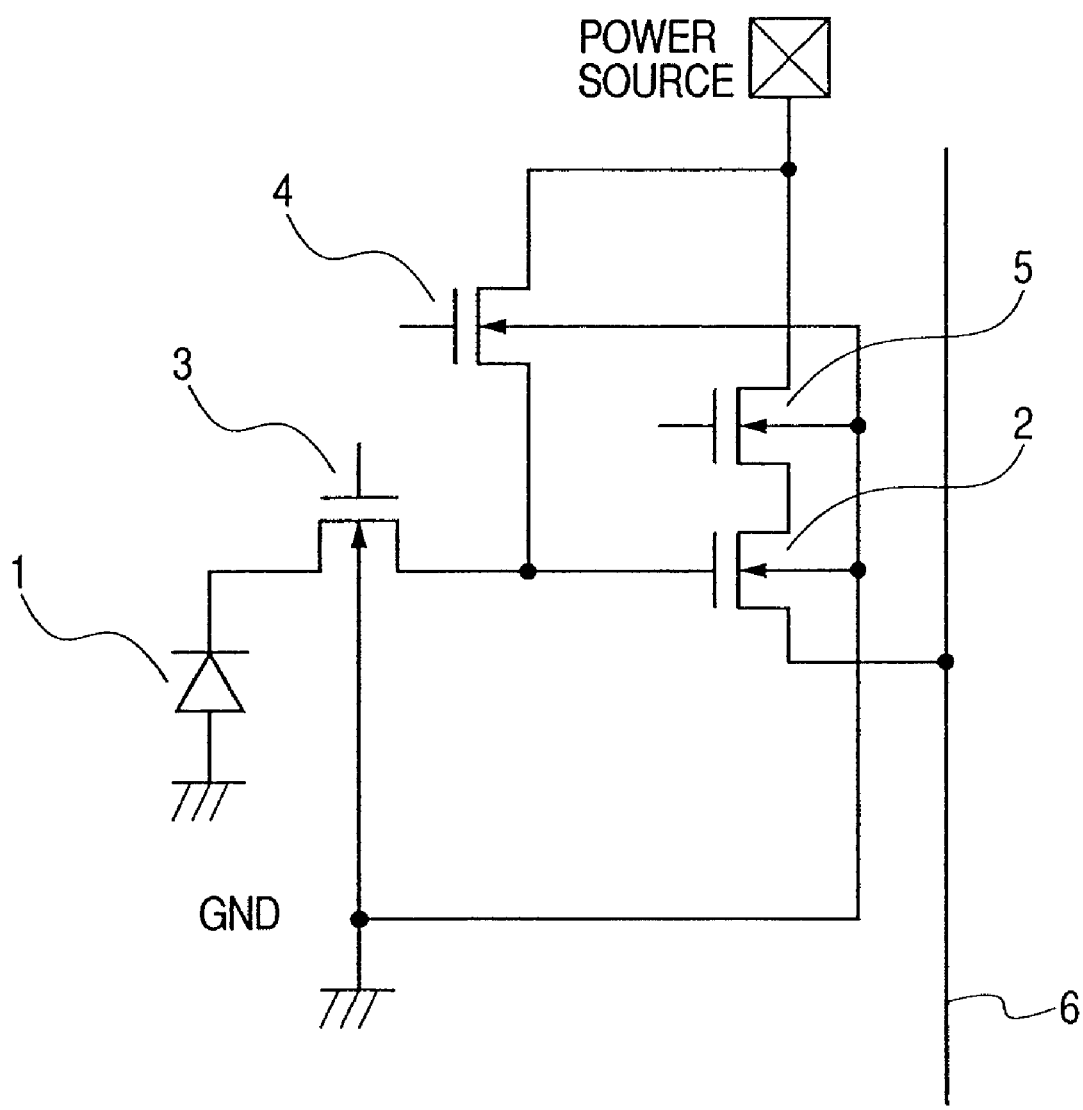
FIG. 12 is an equivalent circuit diagram of the solid state image pickup device formed by using the method of manufacturing the solid state image pickup device of the invention.
Figure 13A:
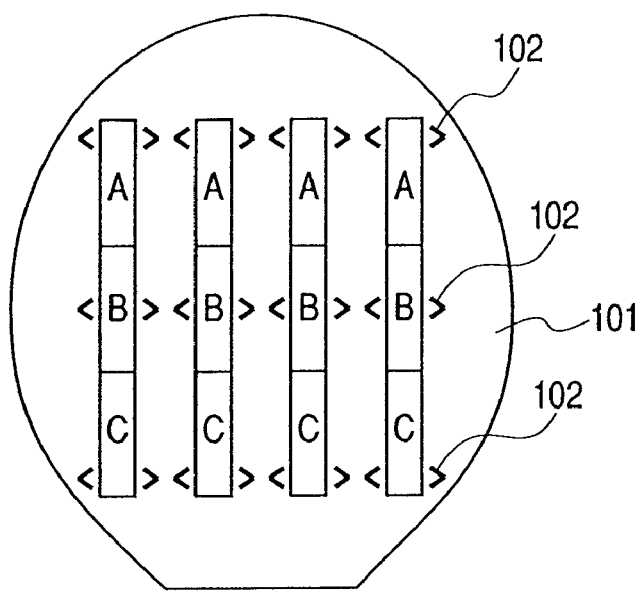
FIGS. 13A, 13B, and 13C are schematic pattern diagrams for explaining a method of manufacturing a semiconductor device in the prior art.
Figure 13B:
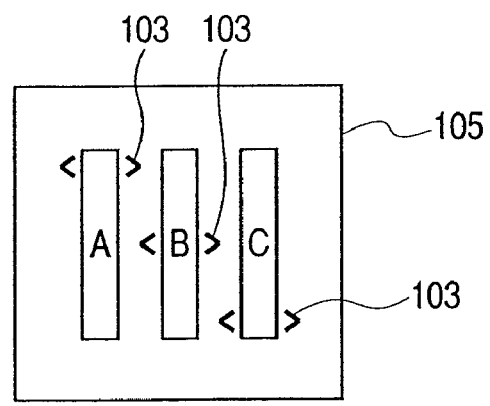
Figure 13C:
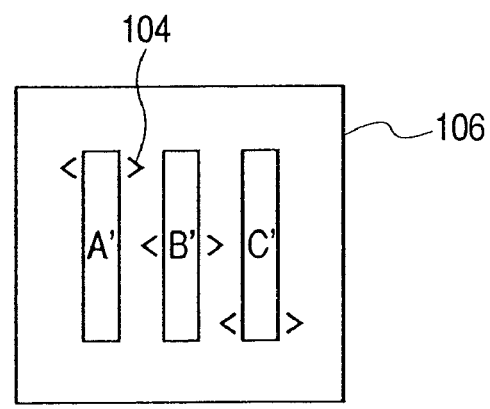

In the invention, the equivalent circuit diagram of the unit pixel is not limited to the example shown in FIG. 6, but can be applied to a semiconductor device and a solid state image pickup device in which a pattern is formed by using both of the connecting exposure and the batch processing of exposure. For example, similar effects are obtained even in a solid state image pickup device in which a plurality of unit pixels each shown in the equivalent circuit diagram of FIG. 12 are arranged in a matrix form. FIG. 12 differs from FIG. 6 with respect to the following point. That is, in FIG. 6, the select MOS transistor 5 is connected to the vertical output line 6 on the side opposite to the source follower input MOS transistor 2. In FIG. 12, the select MOS transistor 5 is connected to the power source on the side opposite to the source follower input MOS transistor 2. Operation timings are similar in both cases.

Moreover, an arrangement is preferred in which the number of wirings, which do not have the area which overlaps the connecting position, is set to be larger than the number of wirings which are formed by the wiring layers which overlap the connecting position.

What is claimed is:

1. A method of manufacturing a solid state image pickup device having a plurality of pixels each including a photoelectric conversion region for converting light into a signal charge, and a plurality of wiring layers including first and second wiring layers, the method comprising steps of:

forming the first wiring layer as a pattern by dividing a desired pattern into a plurality of patterns, connecting the divided patterns, and exposing the plurality of patterns; and forming the second wiring layer as a pattern by batch exposure processing, wherein a connecting position along which the divided patterns are connected is arranged in a pixel area in which the plurality of pixels are arranged, the wiring included in the first wiring layer is formed by a vertical direction wiring arranged in parallel with and not crossing the connecting position in the pixel area, and the wiring included in the second wiring layer is formed by a horizontal direction wiring crossing the connecting position in the pixel area.

2. The manufacturing method according to claim 1, wherein
the first wiring layer includes an output line for outputting a signal from the pixel, and
the second wiring layer includes a driving line for driving the pixel.

3. The manufacturing method according to claim 2, wherein the first wiring layer includes a ground wiring.

4. The manufacturing method according to claim 1, wherein the second wiring layer is arranged above the first wiring layer.

5. The manufacturing method according to claim 1, wherein the first wiring layer is arranged above the second wiring layer.

6. The manufacturing method according to claim 1, further comprising:
a step of forming a Complementary Metal Oxide Semiconductor (CMOS) before the steps of forming the first wiring layer and the second wiring layer.

7. A method of manufacturing a solid state image pickup device having a plurality of pixels each including a photoelectric conversion region for converting light into a signal charge, and a plurality of wiring layers including first and second wiring layers, the method comprising steps of:
forming the first wiring layer as a desirable pattern by dividing a desired pattern into a plurality of patterns, connecting the divided patterns, and exposing the plurality of patterns; and
forming the second wiring layer as a pattern by batch exposure processing, wherein a connecting position along which the divided patterns are connected is arranged in a pixel area in which the plurality of pixels are arranged, the desirable pattern of the first wiring layer is formed by a wiring arranged so as not to cross the connecting position in the pixel area, and the pattern of the second wiring layer is formed by a wiring arranged to cross the connecting position in the pixel area.

8. The manufacturing method according to claim 7, wherein
the wiring of the first wiring layer is a vertical direction wiring arranged in parallel to the connecting position, and
the wiring of the second wiring layer is a horizontal direction wiring.

9. The manufacturing method according to claim 7, wherein
the first wiring layer includes an output line for outputting a signal from the pixel; and
the second wiring layer includes a driving line for driving the pixel.

10. The manufacturing method according to claim 9, wherein the first wiring layer includes a ground wiring.

11. The manufacturing method according to claim 7, wherein the second wiring layer is arranged above the first wiring layer.

12. The manufacturing method according to claim 7, wherein the first wiring layer is arranged above the second wiring layer.

13. The manufacturing method according to claim 7, further comprising:
a step of forming a Complementary Metal Oxide Semiconductor (CMOS) before the steps of forming the first wiring layer and the second wiring layer.

* * * * *